US010511307B2

United States Patent
Flipo et al.

(10) Patent No.: US 10,511,307 B2
(45) Date of Patent: Dec. 17, 2019

(54) CIRCUIT AND SYSTEM IMPLEMENTING A SMART FUSE FOR A POWER SUPPLY

(71) Applicant: OVH, Roubaix (FR)

(72) Inventors: Emmanuel Joseph Henri Flipo, Hem (FR); Christophe Maurice Thibaut, Houplin Ancoisne (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 16/202,573

(22) Filed: Nov. 28, 2018

(65) Prior Publication Data

US 2019/0181862 A1    Jun. 13, 2019

(30) Foreign Application Priority Data

Dec. 13, 2017   (EP) .................................... 17315014

(51) Int. Cl.
| | | |
|---|---|---|
| *H03K 19/00* | (2006.01) | |
| *G06F 1/3234* | (2019.01) | |
| *H03K 19/173* | (2006.01) | |
| *H02H 3/06* | (2006.01) | |
| *H02H 3/087* | (2006.01) | |

(52) U.S. Cl.
CPC ....... *H03K 19/0008* (2013.01); *G06F 1/3243* (2013.01); *H02H 3/06* (2013.01); *H02H 3/087* (2013.01); *H03K 19/1732* (2013.01)

(58) Field of Classification Search
CPC ............ H03K 19/0008; H03K 19/1732; G06F 1/3243
USPC ............................................... 327/37; 326/37
See application file for complete search history.

(56) References Cited

U.S. PATENT DOCUMENTS

| | | |
|---|---|---|
| 3,549,990 A | 12/1970 | Hochheiser |
| 4,799,126 A | 1/1989 | Kruse et al. |
| 4,871,957 A | 10/1989 | Taranto et al. |

(Continued)

FOREIGN PATENT DOCUMENTS

| | | |
|---|---|---|
| CN | 203085784 U | 7/2013 |
| CN | 204088776 U | 1/2015 |

(Continued)

OTHER PUBLICATIONS

European Search Report with regard to the counterpart patent application EP17315014.5 completed Jul. 25, 2018.

(Continued)

*Primary Examiner* — Don P Le
(74) *Attorney, Agent, or Firm* — BCF LLP

(57) ABSTRACT

A circuit includes a voltage source, a transistor, a load current sensor, a hardware latch and a logic circuit. The transistor is connected between the voltage source and a load. The sensor emits a fault signal when the load current exceeds a predetermined value. The hardware latch sets a latch signal when it receives the fault signal and maintains the latch signal until it receives a rearm signal. The logic circuit receives the latch signal from the hardware latch and also receives a software command for controlling turning on and off of the circuit. When the latch signal is not set, the logic circuit converts the software command to a control voltage applied at a gate of the transistor, turning on the transistor to allow power delivery to the load. A system includes a microcontroller providing software commands and rearm signals to a plurality of circuits.

12 Claims, 6 Drawing Sheets

(56) References Cited

U.S. PATENT DOCUMENTS

| | | |
|---|---|---|
| 5,793,596 A | 8/1998 | Jordan et al. |
| 6,210,204 B1 | 4/2001 | Ko et al. |
| 6,382,999 B1 | 5/2002 | Mou et al. |
| 6,937,455 B2 | 8/2005 | Krichtafovitch et al. |
| 7,166,853 B2 | 1/2007 | Rhoads |
| 7,286,330 B2 | 10/2007 | Park |
| 7,312,965 B2 * | 12/2007 | Bax .................. H02H 3/347 361/42 |
| 7,400,118 B1 * | 7/2008 | Zhang ................ H02M 3/1588 323/222 |
| 7,511,437 B2 | 3/2009 | Lys et al. |
| 7,978,743 B2 * | 7/2011 | Deppe ............... H05B 33/0818 372/38.01 |
| 7,995,359 B2 | 8/2011 | Djenguerian et al. |
| 8,363,373 B2 | 1/2013 | Atluri et al. |
| 8,762,083 B2 | 6/2014 | Rodseth et al. |
| 9,178,528 B1 | 11/2015 | Waltari |
| 9,240,290 B2 | 1/2016 | Kim |
| 9,278,225 B2 | 3/2016 | Tol et al. |
| 9,368,954 B1 | 6/2016 | Sizikov et al. |
| 9,509,158 B2 | 11/2016 | Lee |
| 9,513,681 B2 | 12/2016 | Wang et al. |
| 2002/0105767 A1 | 8/2002 | Schuellein et al. |
| 2004/0070910 A1 * | 4/2004 | Gergintschew .... H03K 17/0822 361/103 |
| 2005/0231870 A1 | 10/2005 | Tajika |
| 2007/0070558 A1 | 3/2007 | Liu et al. |
| 2012/0007570 A1 * | 1/2012 | Valenti ............... H02M 5/2573 323/235 |
| 2013/0069612 A1 * | 3/2013 | Feldtkeller ......... H02H 5/048 323/284 |
| 2013/0320779 A1 | 12/2013 | Yang |
| 2014/0254055 A1 | 9/2014 | Xiang |
| 2014/0285172 A1 * | 9/2014 | Teh ................... H02M 3/1588 323/285 |
| 2015/0061769 A1 * | 3/2015 | Bodnar ............... H03G 3/3042 330/282 |
| 2015/0077892 A1 | 3/2015 | Lin et al. |
| 2015/0303917 A1 | 10/2015 | Barnette et al. |
| 2016/0011617 A1 | 1/2016 | Liu et al. |
| 2016/0164429 A1 | 6/2016 | Wang et al. |
| 2017/0038784 A1 | 2/2017 | Rahman et al. |
| 2017/0047771 A1 | 2/2017 | Motsenbocker |
| 2017/0059637 A1 | 3/2017 | Santoso et al. |
| 2017/0093145 A1 | 3/2017 | Nate |
| 2017/0098956 A1 | 4/2017 | Sarti |
| 2018/0013294 A1 * | 1/2018 | Edelson .................. H02J 4/00 |
| 2018/0191147 A1 * | 7/2018 | Graf ................. H03K 17/0822 |
| 2019/0052076 A1 * | 2/2019 | Asam ................. G01R 31/021 |

FOREIGN PATENT DOCUMENTS

| | | |
|---|---|---|
| CN | 206271998 U | 6/2017 |
| DE | 102016114740 B3 | 11/2017 |
| EP | 0617499 A1 | 9/1994 |
| EP | 1150410 A2 | 10/2001 |
| EP | 1150410 A3 | 5/2005 |
| EP | 1962310 A1 | 8/2008 |
| EP | 2672599 A2 | 12/2013 |
| EP | 2672599 A3 | 12/2017 |
| FR | 2710802 A1 | 4/1995 |
| FR | 2941068 B3 | 11/2010 |
| WO | 2017192106 A1 | 11/2017 |

OTHER PUBLICATIONS

Crippen et al., "IBM, BladeCenter packaging, power, and cooling", IBM Journal of Research and Development, vol. 49, No. 6, pp. 887-904.
English Abstract of DE102016114740 retrieved on Espacenet on Aug. 7, 2018.
English Abstract of FR2941068 (A3) retrieved on Espacenet on Aug. 7, 2018.
European Search Report with regard to the counterpart patent application EP17315010.3 completed Jun. 6, 2018.
English Abstract of EP0617499 retrieved on Espacenet on Aug. 10, 2018.
English Abstract of CN203085784 retrieved on Espacenet on Aug. 10, 2018.
English Abstract of CN206271998 retrieved on Espacenet on Aug. 10, 2018.
English Abstract of CN204088776 retrieved on Espacenet on Aug. 10, 2018.
English Abstract of FR2710802 retrieved on Espacenet on Nov. 28, 2018.
European Examination Report with regard to the counterpart patent application EP 17315014.5 dated Jan. 22, 2019.
European Communication pursuant to Article 94(3) EPC with regard to the counterpart patent application EP 17315014.5 dated May 29, 2019.
European Communication pursuant to Article 94(3) EPC with regard to the counterpart patent application EP 17315014.5 dated Oct. 23, 2019.

* cited by examiner

CIRCUIT AND SYSTEM IMPLEMENTING A SMART FUSE FOR A POWER SUPPLY

CROSS-REFERENCE

The present application claims priority from European Patent Application No. 17315014.5, filed on Dec. 13, 2017, the entirety of which being incorporated herein by reference.

TECHNICAL FIELD

The present disclosure relates to the field of electronic power supplies. More specifically, the present disclosure relates to a circuit and a system implementing a smart fuse for a power supply.

BACKGROUND

Large scale networks used for cloud computing, search engines, and similar applications, typically include tens or hundreds of servers for load sharing and for redundancy. These networks need to be highly scalable, so there is a need to frequently add more servers to the network infrastructure.

Large scale server networks consume very large amounts of electric power and generate a lot of heat. Any manner of reducing power consumption is desirable.

Fuses and/or relays may be used to cut delivery of power to a server in case of a fault, for example in the occurrence of a short-circuit. However fuses are typically slow to react and must be replaced after a short-circuit. Relays may protect a server from a short-circuit, and may be rearmed, but are very slow to react. Additionally, current that is provided to a server must flow through contacts of a relay, causing important power losses. Measurements have shown that, typically up to 4% of the power delivered to a server may be lost in a relay. The energy wasted in the relay causes heat accumulation in the power supply that, for a large server bank, translates into important cooling needs.

Availability requirements for large scale server networks are extremely high, so maintenance activities, including connection of additional servers and replacement of failed units must be done without delay and without service disruption.

One particularly disturbing circumstance to personnel who install servers is that inrush of electrical current into a server when initially plugged into a power supply oftentimes causes sparks at the level of a plug-in connection. Such sparks can be quite disturbing to the operators who install the servers and may also cause the accumulation of carbon deposits on connectors. The carbon deposits create undesired impedance on the connectors, causing of power losses and eventually causing failed connections to some servers. These carbon deposits may eventually lead to fire hazards.

Thus, there is a desire for power supplies that address the aforementioned drawbacks.

SUMMARY

According to one aspect of the present technology, there is provided a circuit for powering a load, comprising: a voltage source; a transistor connected in series with the voltage source, the transistor further having a gate for turning on and off the transistor, the transistor being connectable in series with the load; a sensor of a load current, the sensor being adapted to emit a fault signal when the load current exceeds a first predetermined current value; a hardware latch adapted to set a latch signal when it receives the fault signal and to maintain the latch signal until it receives a rearm signal; and a logic circuit adapted to receive the latch signal from the hardware latch and to receive a software command for controlling turning on and off of the circuit, the logic circuit converting the software command to a control voltage for application at the gate of the transistor when the latch signal is not set.

In some implementations of the present technology, the sensor of the load current comprises: a sense resistor connected in series with the transistor; and a current monitor emitting an output voltage proportional to a current flowing through the sense resistor.

In some implementations of the present technology, the output voltage is sufficient to latch the hardware latch when the load current exceeds the first predetermined current value.

In some implementations of the present technology, the latch signal is a status of the circuit, the latch signal being not set when the circuit has a normal status.

In some implementations of the present technology, the logic circuit comprises: a combiner of the status of the circuit and of the software command; and a coupler of the logic circuit and of the transistor, the coupler being configured to cause the control voltage to be applied at the gate of the transistor.

In some implementations of the present technology, the control voltage is a positive voltage to turn on the transistor, the circuit further comprising: a boost voltage source, a boost voltage of the boost voltage source being greater than a voltage of the voltage source; and a resistive divider connected to the boost voltage source, to the gate of the transistor, and to the coupler; wherein deactivation of the coupler causes the boost voltage to be applied at the gate of the transistor and turning on of the transistor; and wherein activation of the coupler causes a voltage applied at the gate to be less than the boost voltage and turning off of the transistor.

In some implementations of the present technology, the circuit further comprises a microcontroller adapted to provide the software command for controlling turning on and off of the circuit.

In some implementations of the present technology, the microcontroller is further adapted to provide the rearm signal.

In some implementations of the present technology, the microcontroller is operatively connected to the sensor of the load current and is adapted to control turning off of the circuit when load current exceeds a second predetermined value, the second predetermined value being less than the first predetermined value.

According to another aspect of the present technology, there is provided a system for powering multiple loads, comprising: a voltage source; one or more channels, each channel being configured for powering a respective load, each channel comprising: a transistor connected in series with the voltage, the transistor further having a gate for turning on and off the transistor, the transistor being connectable in series with the respective load, a sensor of a load current, the sensor being adapted to emit a fault signal when the load current exceeds a first predetermined current value, a hardware latch adapted to set a latch signal when it receives the fault signal and to maintain the latch signal until it receives a rearm signal, and a logic circuit adapted to receive the latch signal from the hardware latch and to receive a software command for controlling turning on and off of the transistor, the logic circuit converting the software command to a control voltage for application at the gate of the transistor when the latch signal is not set; and a microcontroller operatively connected to the hardware latch and to the logic circuit of each channel, the microcontroller being adapted to provide software commands for individually turning on and off the transistor of each channel and to provide rearm signals for individually resetting the hardware latch of each channel.

In some implementations of the present technology, the microcontroller is adapted to individually receive the latch signal of each channel, the microcontroller interpreting the latch signal from a given channel as a normal status of the given channel when the latch signal is not set; the microcontroller is adapted to individually receive a measurement of a load voltage for each channel; and the microcontroller is adapted to individually receive a measurement of the load current for each channel In some implementations of the present technology, the one or more channels comprise a plurality of channels, the system further comprising: a first demultiplexer adapted to individually transmit the software commands to the logic circuit of each channel; and a second demultiplexer adapted to individually transmit the rearm signals to the hardware latches of each channel.

In some implementations of the present technology, the system further comprises a first multiplexer adapted to individually receive the latch signal from each of the plurality of channels; a second multiplexer adapted to individually receive the measurement of the load voltage from each of the plurality of channels; and a third multiplexer adapted to individually receive the measurement of the load current from each of the plurality of channels.

In some implementations of the present technology, the microcontroller is adapted to: detect the status of each individual channel; conditionally forward a software command to the logic circuit of a given channel for turning on the transistor of the given channel when the status of the given individual channel is normal.

In some implementations of the present technology, the system further comprises a momentary switch operatively connected to the microcontroller, wherein the microcontroller is further adapted to: detect a rearm command from the momentary switch; detect that statuses of one or more of the plurality of channel are not normal; and forward a rearm signal to the one or more of the plurality of channels.

The foregoing and other features will become more apparent upon reading of the following non-restrictive description of illustrative embodiments thereof, given by way of example only with reference to the accompanying drawings.

BRIEF DESCRIPTION OF THE DRAWINGS

Embodiments of the disclosure will be described by way of example only with reference to the accompanying drawings, in which.

Like numerals represent like features on the various drawings.

DETAILED DESCRIPTION

Figure 1:
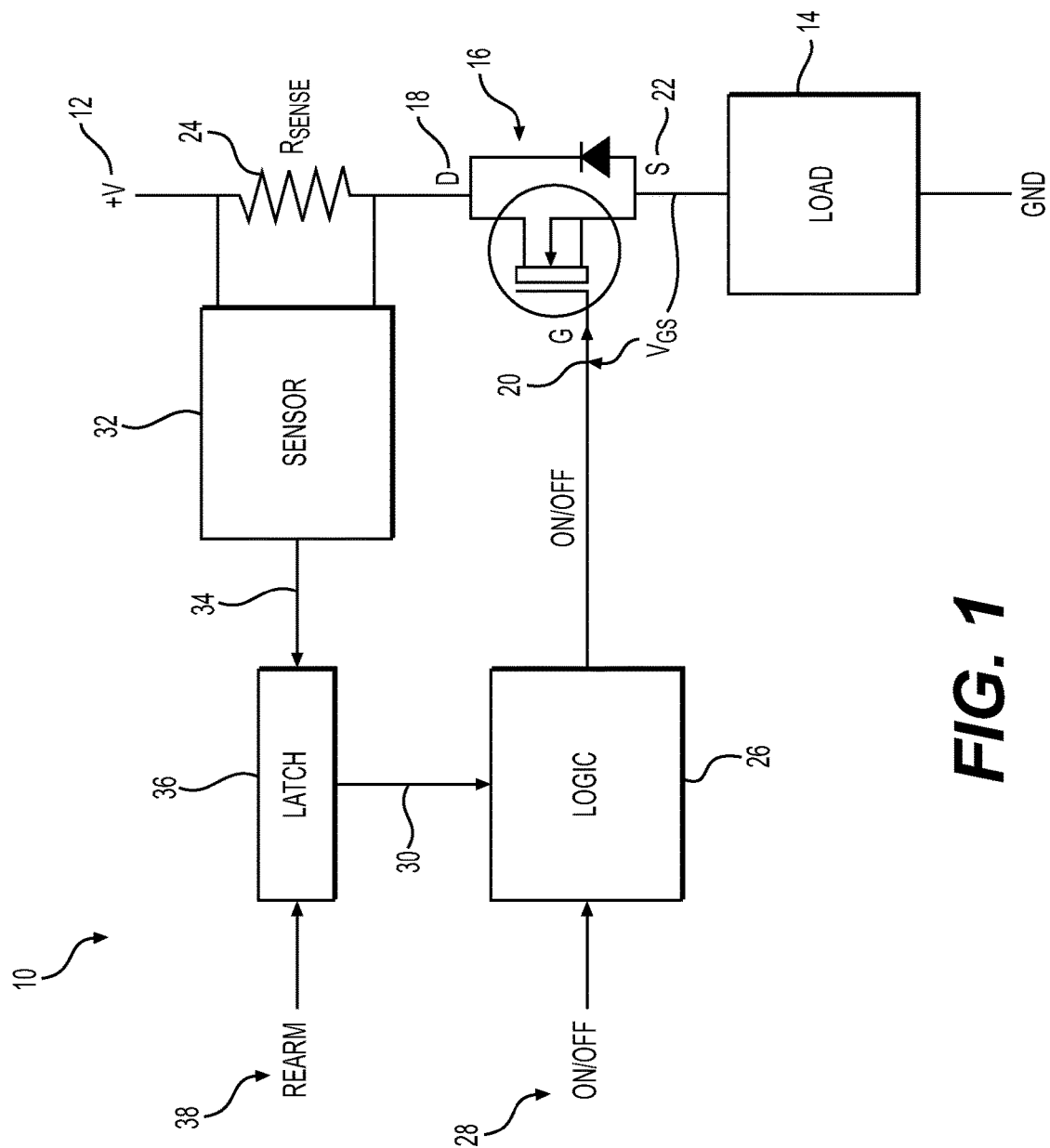
FIG. 1 is a highly schematic diagram of a circuit for switching on and off electrical supply to a load.

Various aspects of the present disclosure generally address one or more of the problems found in conventional power supplies for large scale server networks. To this end, the present disclosure introduces a circuit for powering a load, this circuit being adapted for integration into a power supply.

In a first embodiment, the circuit comprises a voltage source, a sense resistor, and a transistor connected in series with the voltage source and with the sense resistor. The load may be connected in series with the transistor. The transistor can be turned on and off by the application of a control voltage on its gate. A voltage across the sense resistor is sensed. Because the sense resistor is in series with the load, this voltage provides a direct indication of a level of current flowing in the load. The sensor emits a fault signal when the voltage across the sense resistor exceeds a predetermined value or, equivalently, when the current load exceeds a safe level, for example in the case of a short circuit at the load. The circuit includes a hardware latch that issues a latch signal when it receives the fault signal. The latch signal is maintained in the hardware latch even if the load current falls again to a safe value, or to zero. The latch signal is maintained until the hardware latch signal receives a rearm signal. A logic circuit is fed with the latch signal from the hardware latch and with a software command intended to control turning on and off of the circuit. The logic circuit converts the software command to a control voltage for application at the gate of the transistor when the latch signal is not set. In the circuit of this embodiment, the transistor is thus a "smart fuse" that is turned off to cut the flow of current into the load in case of a fault and that can be modulated by the software command to control a level of the current into the load in normal operation.

In the same or another embodiment, the circuit for powering a load comprises a primary voltage source and a secondary voltage source. A primary transistor connects the primary voltage source to a load connector. A top resistor connects the secondary voltage source to a gate of the primary transistor while a bottom resistor is connected in parallel to the load connector. A secondary transistor is connected between the top resistor and the bottom resistor so that a drain of the secondary transistor is connected to the gate of the primary transistor. The circuit includes a translator of commands for turning on and off the circuit. The translator applies a high voltage at a gate of the secondary transistor when receiving an off command and a low voltage at the gate of the secondary transistor when receiving an on command. In the circuit, a microcontroller initially issues the off command, which is received at the translator, causing turning on of the secondary transistor and turning off of the primary transistor. The microcontroller receives a measurement of a voltage at the load connector. Initially, the voltage is defined by a resistive divider of the secondary voltage source, the resistive divider being formed by the top and bottom resistor. The microcontroller detects that the load is not connected to the load connector when the voltage at the load connector is at a high level while the off command is being issued. When the load is connected to the load detector, because its impedance is much lower than that of the bottom resistor, the microcontroller detects that the voltage at the load connector falls to a low level while the off command is being issued. The microcontroller may then issue the on command in response to the detection of the connection of the load. The on command may be issued in the form of an impulse, followed again by the off command, so that the primary transistor is only briefly turned on. The microcontroller may issue a sequence of such on command impulses so that the flow of current gradually increases in the load.

Referring now to the drawings, FIG. 1 is a highly schematic diagram of a circuit for switching on and off electrical supply to a load. A circuit 10 includes a voltage source 12, a load 14, a transistor 16 having a drain (D) 18, a gate (G) 20 and a source (S) 22, and a sense resistor 24. In the circuit 10, the sense resistor 24, the transistor 16 and the load 14 are connected in series between the voltage source 12 and the ground (GND). The transistor 16 is turned on (i.e. closed) to allow current to flow from the voltage source 12 through the sense resistor 24 and the drain 18 and the source 22 of the transistor 16, reaching the load 14. The transistor 16 is turned on by the application at its gate 20 of a voltage higher than a voltage at the source 22, this voltage being an "ON" command for the transistor 16. In more detail, the transistor 16 is turned on when its gate to source voltage $V_{GS}$ is greater than a threshold voltage $V_{th}$ for the transistor 16. Application of a low voltage (an "OFF" command) at the gate 20, $V_{GS}$ being lower than $V_{th}$ for the transistor 16, turns off (i.e. opens) the transistor 16 to prevent delivery of current to the load 14.

The ON/OFF command is applied at the gate 20 by a logic circuit 26. The logic circuit 26 has two (2) inputs, i.e. a software ON/OFF command 28 from a microcontroller (shown in a later Figure) and a latch command 30. When the latch command 30 is not set, the logic circuit 26 converts the software ON/OFF command 28 into the high (ON) or low (OFF) voltage applied at the gate 20.

A voltage across the sense resistor 24 is sensed by a sensor 32. The sensed voltage is directly proportional to the current flowing through the sense resistor 24, the transistor 16 and the load 14. When this current exceeds a predetermined safe value, the sensed voltage also exceeds a corresponding predetermined value. In that event, the sensor 32 sends a fault signal 34 to a hardware latch 36. The hardware latch 36 in turn provides the latch command 30 to the control logic circuit 26. As the latch command 30 is set, the logic circuit 26 ignores the software ON/OFF command 28 and applies a low (OFF) voltage at the gate 20, turning off the transistor 16.

Although current no longer flows through the sense resistor 24, the transistor 16 and the load 14 when the transistor 16 is turned off, the hardware latch 36 maintains the latch command 30 until it receives a rearm command 38. The latch command 30 is removed when the rearm command 38 is received at the hardware latch 36, following which the logic circuit 26 can once again convert the software ON/OFF command 28 into the high (ON) or low (OFF) voltage applied at the gate 20.

The circuit 10 therefore implements a smart fuse in the sense that the transistor 16 can rapidly react, under hardware control, in case of excessive current flowing through the load 14, for example in case of a short circuit. This smart fuse can be rearmed by the rearm signal 38. In normal operation of the circuit 10, when the latch command 30 is not set, the ON/OFF command 28 from the microcontroller may be used to turn on or off the delivery of power to the load 14 and may further be used to control the amount of current into the load 14 by turning on and off the transistor 16 in rapid cycles.

Figure 2:
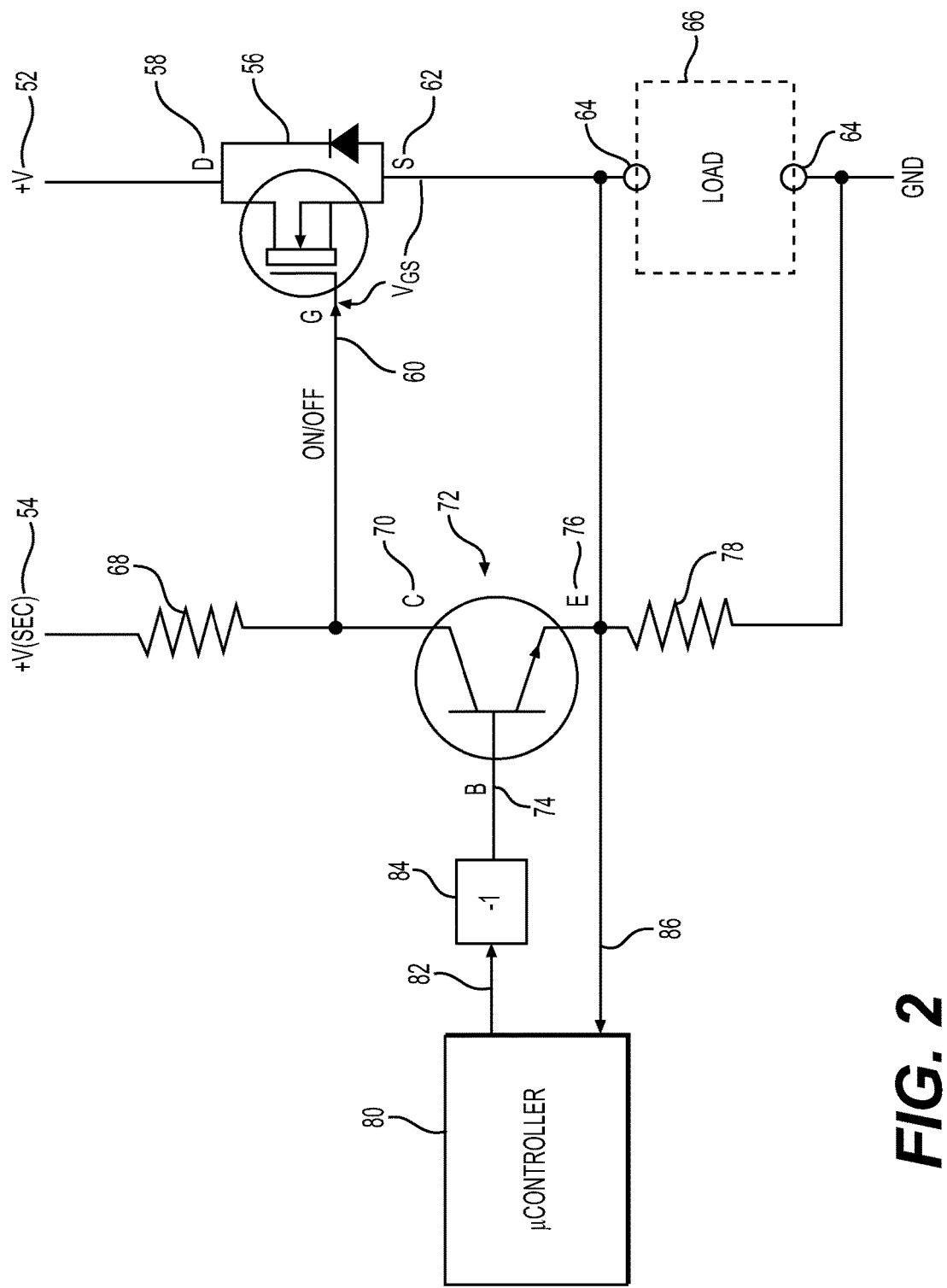
FIG. 2 is a highly schematic diagram of a circuit for detecting attachment of a load and for gradually applying current to the load.

FIG. 2 is a highly schematic diagram of a circuit for detecting attachment of a load and for gradually applying current to the load. A circuit 50 may optionally be combined in a same implementation with the circuit 10 of FIG. 1, but is shown in isolation in order to simplify the illustration of FIG. 2. The circuit 50 includes a primary voltage source 52 and a secondary voltage source 54, also called a boost voltage source because its voltage is higher than that of the primary voltage source 52. A primary transistor 56, for example a metal oxide semiconductor field effect transistor (MOSFET), such as an n-channel MOSFET (NMOS) having a drain 58, a gate 60 and a source 62, is connected to the primary voltage source 52 and to a connector 64 having a pair of ports for eventually connecting a load 66. A top resistor 68 is connected to the secondary voltage source 54, to the gate 60 of the primary transistor 56, and to a collector (C) 70 of a secondary transistor 72, for example a bipolar transistor. The secondary transistor 72 also has a base (B) 74 and an emitter (E) 76. The emitter 76 of the secondary transistor 72 is connected to a bottom resistor 78, to the source 62 of the primary transistor 56, and to a positive end of the connector 64.

A microcontroller 80 applies a software ON/OFF command 82 to a translator 84. The software command 82 is a logical 1 to turn ON the circuit 50 and a logical 0 to turn OFF the circuit 50.

The translator 84 outputs a negative version of the software ON/OFF command, the ON command being translated into a low voltage applied on the base 74 of the secondary transistor 72 and the OFF command being translated into a high voltage applied on the base 74 of the secondary transistor 72.

When the software ON/OFF command 82 requires turning off of the circuit 50, a high voltage is applied at the base 74 of the secondary transistor 72. This high voltage turns on the secondary transistor 72, whereby the voltage at its collector 70 and at the gate 60 of the primary transistor 56 becomes substantially equal to the voltage at the source 62 of the primary transistor 56, neglecting a small voltage drop between the collector 70 and the emitter 76 of the secondary transistor 72. The voltages at the gate 60 and at the source 62 of the primary transistor 56 being substantially equal, $V_{GS}$ is near zero and is less than $V_{th}$ for the primary transistor 56. The primary transistor 56 is therefore turned off. At the time, if the load 66 is not connected, the voltage at the source 62 of the primary transistor 56, which is also the voltage at the load connector 64, is defined by the voltage of the secondary voltage source 54 and a resistive divider formed by the top resistor 68 and the bottom resistor 78. If the load 66 is then connected, because it usually has a much lower impedance than that of the top resistor 68 and of the bottom resistor 78, the voltage at the load connector 64 falls to nearly zero volt.

Conversely, when the software ON/OFF command 82 requires turning on the circuit 50, this command is translated by the translator 84 into the low voltage applied at the base 74 of the secondary transistor 72. This low voltage turns off the secondary transistor 72, whereby the voltage at its collector 70, which is also the voltage at the gate 60 of the primary transistor 56, becomes equal to the voltage of the secondary voltage source 54. The voltage of the secondary voltage source 54 being higher than the voltage of the primary voltage source 52, the gate to source voltage $V_{GS}$ of the primary transistor 56 is positive, no matter the voltage at the source 62 of the primary transistor 56 at that time. In the example as shown, the primary transistor 56 is an NMOS transistor so the positive gate to source voltage $V_{GS}$ causes turning on of the transistor 56, whereby the voltage at its source 62 becomes substantially equal to the voltage of the primary voltage source 52. It will be understood that the voltage of the secondary voltage source 54 is selected to be higher than the voltage of the primary voltage source 52 by a sufficient amount to ensure that $V_{GS}$ will be greater than $V_{th}$ for the primary transistor 56 when the secondary transistor 72 is turned off.

When the software ON/OFF command 82 is "OFF", the high voltage applied at the base 74 causes closing (turning on) of the secondary transistor 72. If the load 66 is not connected to the connector 64, the voltage of the gate 60 and the source 62 of the primary transistor 56 is an intermediate voltage defined by the secondary voltage source 54 and by the resistive divider formed by the resistors 68 and 78. The gate to source voltage $V_{GS}$ of the primary transistor 56 being near zero, the primary transistor 56 is open. A voltage measurement 86 taken between the resistors 62 and 68 is provided to the microcontroller 80. Connecting the load 66 to the connector 64 at that time causes the voltage at the gate 60 and the source 62 of the primary transistor 56 to decrease significantly to a low voltage because the load 66 has a much lower impedance than that of the resistor 78. This drop of the voltage measurement 86 is detected at the microcontroller 80 as an indication that the load 66 is now connected to the circuit 50.

Thereafter, the microcontroller 80 changes the software ON/OFF command 82 to "ON", causing a low voltage to be applied at the base and causing opening of the secondary transistor 72. The voltage of the secondary voltage source 54 is now directly applied at the gate 60 of the primary transistor 56. The gate 60 of the primary transistor 56 now being at a high voltage, the transistor 56 becomes conductive because $V_{GS}$ is now greater than $V_{th}$. Current may flow from the primary voltage source 52 though the primary transistor 56 and into the load 66. The voltage at the source 62 of the primary transistor 56 is now substantially equal to the voltage of the primary voltage source 52, neglecting for a minor voltage drop between the drain 58 and the source 62 of the primary transistor. $V_{GS}$ is substantially equal to the voltage of the secondary (boost) voltage source 54 minus the voltage of the primary voltage source 52. As will be expressed hereinbelow, the microcontroller 80 may rapidly cycle the software ON/OFF command 82 between the ON and OFF positions, at least for a brief initial period after the connection of the load 66, to control the inrush of current into the load 66 when the load 66 is initially plugged in at the connector 64. The microcontroller 80 may continuously monitor the voltage measurement 86 on the load 66.

Figure 3:
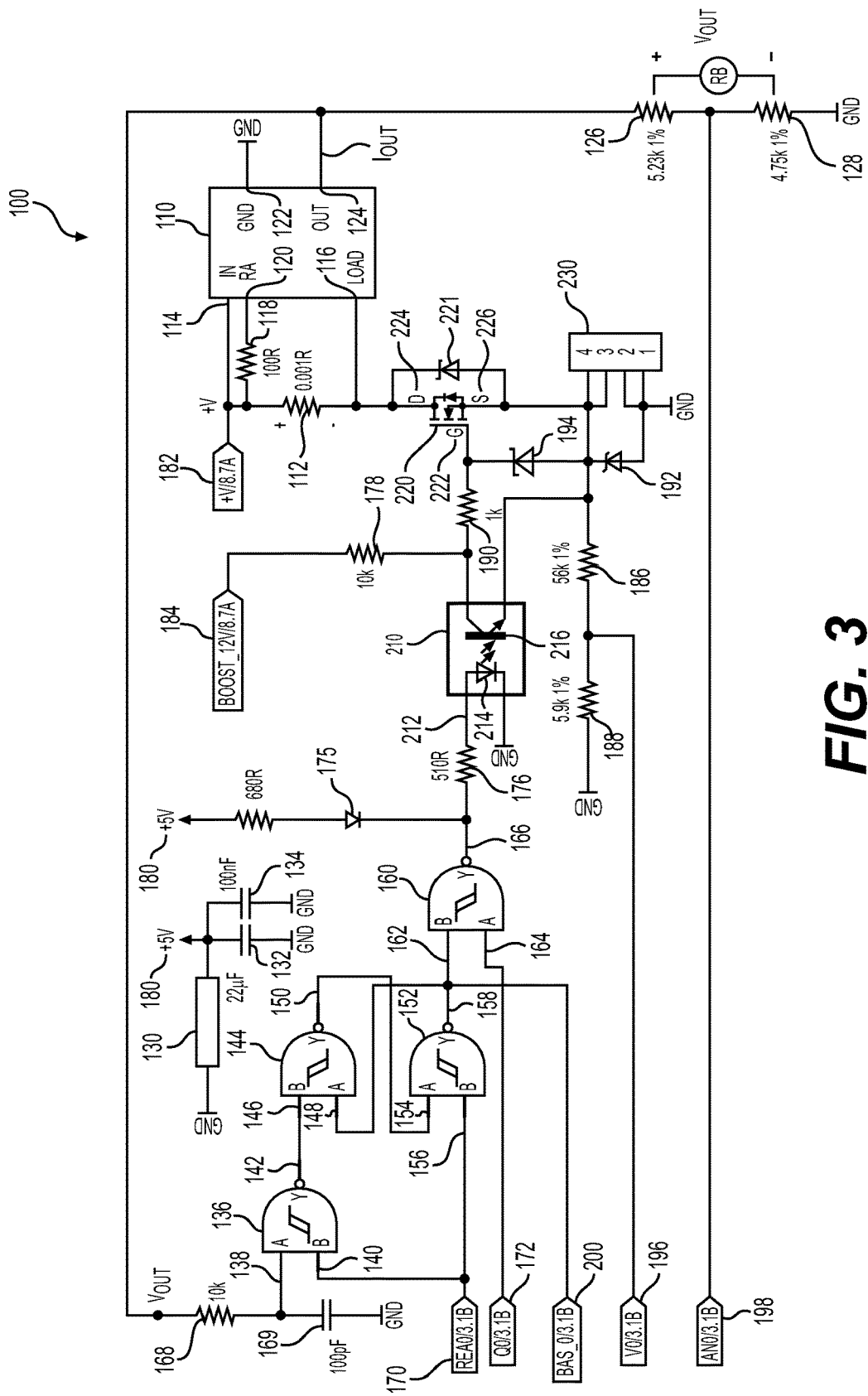
FIG. 3 is an electrical diagram of a circuit for switching on and off electrical supply to a load, for example a computer or a server.

A practical implementation of the circuits 10 and 50 of FIGS. 1 and 2 is shown on FIG. 3, which is an electrical diagram of a circuit for switching on and off electrical supply to a load, for example a computer or a server. A circuit 100 includes a high side current monitor 110, a quad 2-input NAND Schmitt trigger 130, an optocoupler 210, which is a secondary transistor for the circuit 100, a MOSFET switch 220, which is a primary transistor for the circuit 100, a 5-volt source 180, a load voltage source 182 providing for example 19 volts, a boost voltage source 184 providing for example 31 volts, which translates into a 12-volt boost over the voltage of the load voltage source 182, and a load connector 230. The circuit 100 also comprises various signal input ports, resistors, diodes, Zener diodes and capacitors that are described in the following paragraphs. Values shown on FIG. 3 for the various resistors, capacitors, including their tolerances, and for illustration purposes and do not limit the present disclosure. The MOSFET switch 220 operates as a smart fuse, as will be explained hereinbelow. A freewheeling diode 221 is mounted in parallel to the MOSFET switch 221 to eliminate any eventual voltage spikes that might occur when turning on and off the MOSFET switch 220, for example when an inductive load is plugged in the load connector 230.

In normal operation of the circuit 100, the load, for example the server or computer, is connected to the load connector 230. Power to the load is from the load voltage source 182 and transmitted via the MOSFET switch 220, which may also be called a high side switch, to ports 3 and/or 4 of the load connector 230, ports 1 and/or 2 of the load connector 230 providing a ground connection for the server.

Current flowing from the load voltage source 182 through the MOSFET switch 220 and through the server also flows through a sense resistor 112. The sense resistor 112 has a very low impedance, for example $10^{-3}$ ohm to maintain power consumed in the sense resistor 112 at a negligible level. A voltage $V_{sense}$ across the sense resistor 112 is detected by the high side current monitor 110, between its input 114 (marked "IN") and its sense amplifier input 116 (marked "LOAD"). The high side current monitor 110 has a gain defined by a transconductance resistor 118 connected between the higher voltage side of the sense resistor 112 (marked "+") and a transconductance input 120 (marked "RA") of the high side current monitor 110. Without limitation, the transconductance resistor 118 has an impedance of 100 ohms, the transconductance gain of the high side current monitor 110 being $10^{-2}$ mho. The high side current monitor 110 has a ground connection 122 and an output 124. A current $I_{out}$ flowing from the output 124 is equal to the voltage across the sense resistor 112 multiplied by the transconductance gain of the high side current monitor 110. For example, when a load current of 10 amperes flows through the sense resistor 112 (as well as through the MOSFET switch 220 and the server connected to the connector 230), $V_{sense}$ is equal to $10^{-2}$ volt the current $I_{out}$ is at $10^{-4}$ ampere. The current $I_{out}$ generates a voltage $V_{out}$ across a resistor RB formed of a series combination of resistors 126 and 128. In the example as shown, RB has an impedance of about 10 K ohms and $V_{out}$ is equal to 1 volt when the load current is of 10 amperes.

The quad 2-input NAND Schmitt trigger 130 is powered by the 5-volt source 180 and is also connected to the ground. Capacitors 132 and 134 filter eventual variations of the 5-volt source 180, which might otherwise vary in operation of the quad 2-input NAND Schmitt trigger 130. The quad 2-input NAND Schmitt trigger 130 includes four (4) NAND gates 136, 144, 152 and 160. Each NAND gate has two (2) inputs and an output, as described in more details below. The output of any of these NAND gates is a logical 0 when both of its inputs are a logical 1, and a logical 1 in all other cases.

The voltage $V_{out}$ is also present at an input 138 of the NAND gate 136, being filtered by a resistor 168 and a capacitor 169. When $V_{out}$ exceeds a trigger voltage for the NAND gate 136, for example in case of a fault such as a short circuit in the load connected to the load connector 230, $V_{out}$ becomes a logical 1 applied at the input 138. $V_{out}$ can therefore be understood as a logical signal for indicating that the load current exceeds a predetermined value when $V_{out}$ exceeds that trigger voltage. It may be noted that because the NAND gate 136 is a Schmitt-Trigger, slight variations of $V_{out}$ will not cause oscillations at the output 142 of the NAND gate 136. The values of the sense resistor 112, of the transconductance resistor 118, and of the resistor RB formed of the series combination of resistors 126 and 128 are selected so that $V_{out}$ reaches the trigger voltage for the NAND gate 136 when the load current reaches a maximum desired value. In an implementation, these elements may be selected so that $V_{out}$ only reaches the trigger voltage for the NAND gate 136 in case of a severe fault, for example in case of a short-circuit at the load.

Another input 140 of the NAND gate 136 is an input port 170 on which a rearm signal may be received for rearming the circuit 100. When the ream signal is a logical 1 while $V_{out}$ exceeds the trigger voltage for the NAND gate 136, an output 142 of the NAND gate 136 is a logical 0. The output 142 of the NAND gate 136 is a logical 1 when $V_{out}$ does not exceed the trigger voltage (the current being within the intended range) and/or when the rearm signal is a logical 0.

The NAND gates 144 and 152 are combined into a NAND-gate latch. A first input of the NAND-gate latch is the output 142 of the NAND gate 136, applied to an input 146 of the NAND gate 144. A second input of the NAND-gate latch is the rearm signal from the input port 170, applied to an input 156 of the NAND gate 152. An output 150 of the NAND gate 144 is applied at an input 154 of the NAND gate 152 while an output 158 of the NAND gate 152 is applied to an input 148 of the NAND gate 144, completing the NAND-gate latch. The output 158 of the NAND gate 152 is the overall output of the NAND-gate latch and, at the same time, represents a status of the circuit 100. This status is a logical 1 under normal conditions, when the current flowing through the load is within the intended range, $V_{out}$ not exceeding the trigger voltage. At that time, the value of the rearm signal from the input port 170 has no impact on the output 158. When $V_{out}$ increases and becomes a logical 1, the status of the circuit 100 becomes a logical 0, as long as the rearm signal is also a logical 1. The status of the circuit 100 may be reset to become a logical 1 again by temporarily setting the rearm signal to a logical 0.

A software command Q0 from an input port 172 is set to a logical 1 to turn on the MOSFET switch 220 or to a logical 0 to turn off the MOSFET switch 220. The software command Q0 provides ON and OFF commands to the circuit 100, to control the application of current to the load on the load connector 230. The software command Q0 is applied to an input 164 of the NAND gate 160. The output 158 from the NAND gate 152 (which is also the output from the NAND-gate latch, i.e. the status of the circuit 100) is applied to an input 162 of the NAND gate 160. An output 166 of the NAND gate 160 is determined as follows: If the NAND-gate latch is latched to provide a logical 0, resulting from $V_{out}$ having exceeded the trigger voltage of the NAND gate 136, the output 166 of the NAND gate 160 is a logical 1 and will remain as such until the rearm signal is set to a logical 0, at least temporarily. Otherwise, if the NAND-gate latch is latched to provide a logical 1, which is a normal circumstance, the NAND gate 160 translates the software command Q0, providing a logical inverse of the software command Q0 at its the output 166, so that the output 166 is a logical 0 when the software command Q0 is a logical 1, and vice-versa. The NAND gate 160 therefore combines effects of the software command Q0 and of the status of the circuit 100.

The output 166 of the NAND gate 160 is connected to a resistive divider formed of resistors 174 and 176 that connect the 5-volt source 180 to an input 212 of the optocoupler 210. Provided that the NAND-gate latch provides a logical 1 while the software command Q0 is set to 1, the output 166 of the NAND gate 160 is set to 0, which translates into a low voltage present within between the resistors 174 and 176. Current flowing through the resistor 174 and the NAND gate 160 turns on a light emitting diode (LED) 175 to provide a visual indication that the circuit 100 is turned on. A LED 214 integrated in the optocoupler 210 is de-energized, whereby a phototransistor 216 of the optocoupler 210 is turned off and becomes an open circuit. A voltage from the boost voltage source 184 is substantially present at a gate 222 of the MOSFET switch 220. This boost voltage being selected to be higher by at least a threshold voltage of the MOSFET source 220 than any voltage present at the source 226 of the MOSFET switch 220 at that time, the MOSFET switch 220 becomes conductive. Current may flow from the load voltage source 182 through the sense resistor 112, the MOSFET switch 220 and the load connected to the load connector 230. It may be observed that a resistance between a drain 224 and a source 226 of the MOSFET switch 220 is very low, typically in the order of $10^{-2}$ ohm when the MOSFET switch 220 is turned-on, so any amount of power consumed in the MOSFET switch 220 is negligible.

When, however, the output 166 of the NAND gate 160 is set to 1, whether because the software command Q0 is set to 0 or because the NAND-gate latch provides a logical 0, a high voltage is present at the output 166 of the NAND gate 160, between the resistors 174 and 176. Current no longer flows through the LED 175, which is turned off to provide a visual indication that the circuit 100 is no longer providing power to the load. The LED 214 of the optocoupler 210 is energized, whereby the phototransistor 216 is turned on and becomes conductive. The gate 222 and the source 226 of the MOSFET switch 220 are now connected via a resistor 190. No significant current flows through the resistor 190, which means that the voltage at the gate 222 is essentially the same as the voltage at the drain 226. Its gate to source voltage being about zero, the MOSFET switch 220 is then turned off and non-conductive, preventing the flow of current between the load voltage source 182 and the load connector 230.

It may be observed that while another type of secondary transistor may be used, the optocoupler 210 provides voltage isolation components of the circuit 100 powered by the 5-volt source 180 and other components of the circuit 100 powered by the load voltage source 182 and the boost voltage source 184.

Overvoltage protection for the load and the MOSFET switch 220 is implemented as follows. A voltage on the load connected to the connector 230 is limited by a Zener diode 192, for example a 60-volt diode, that will become conductive if that voltage becomes excessive. Likewise, regardless of the voltage at the boost voltage source 182 and the voltage at the source 226 of the MOSFET switch 220 at any given time, the gate 222 to source 226 voltage of the MOSFET switch 220 is limited by the presence of a Zener diode 194, for example a 10-volt diode, placed between the gate 222 and the source 226.

A measure of a voltage applied on the load when the MOSFET switch 220 is conductive is available at an output port 196. This measure is not a direct value of the voltage applied on the load because it is obtained from a voltage divider formed of the resistors 186 and 188. For example, when the load voltage source 182 is a 48-volt source, the resistors 186 and 188 respectively have 56K ohms and 5.9K ohms so that the voltage at the output port 196 is about 4.5 volts. The measure applied at the output port 196 is in any case directly proportional to the actual load voltage. Likewise, a measure of the current flowing through the load is available at an output port 198. The current is sensed by reading a fraction of $V_{out}$, sensed between resistors 126 and 128, this value being directly proportional to the current $I_{out}$, which in turn is directly proportional to the current. Respective values of the resistors 126 and 128 are selected in part to maintain the current measurement at the output port 198 within a safe voltage range for equipment connected to the output port 198. A status of the circuit 100, which is the output 158 of the NAND gate 152, is available at an output port 200. Signals from the output ports 196, 198 and 200 are provided from the circuit 100 to a microcontroller (shown in a later Figure), the microcontroller providing the software command Q0 available at the input port 172.

Figure 4:
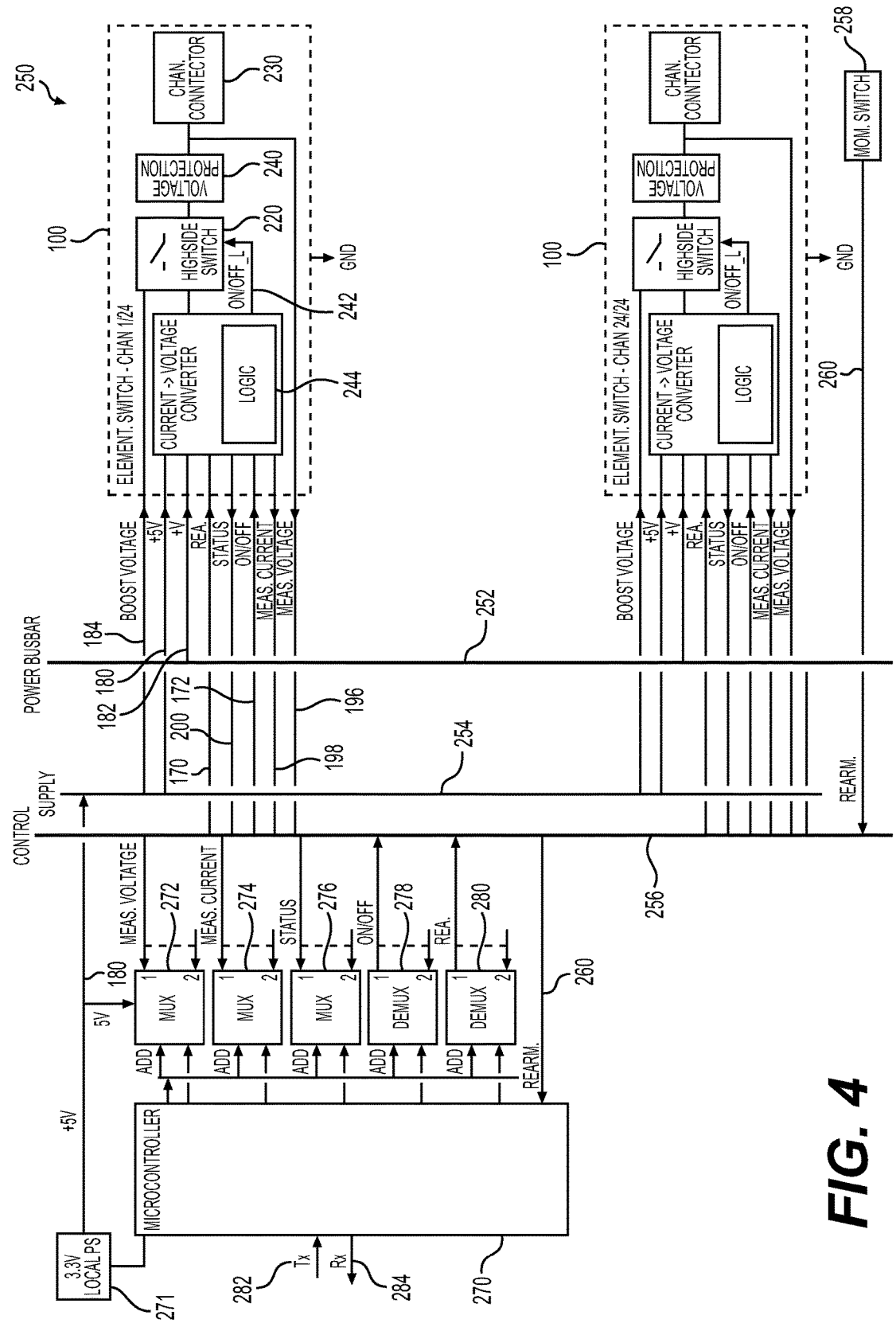
FIG. 4 is schematic diagram of system for switching on and off electrical supply to a server of a server bank.

FIG. 4 is schematic diagram of system for switching on and off electrical supply to a server of a server bank. A system 250 is adapted to provide power to a bank of 24 servers over 24 distinct channels. Variants of the system 250 may provide power to a single server over a single channel or to any other number of servers over any number of channels. Each channel includes a copy of the circuit 100 of FIG. 3. Each channel operates independently from the other channels. Within the circuit 100, the Zener diodes 192 and 194 are schematically represented as a voltage protection module 240. Control applied at the gate 222 of the MOSFET switch 220 is schematically represented as an ON/OFF command 242. The various other components of the circuit 100 are schematically represented as a converter and logic module 244.

The load voltage source 182 is supplied by a power bus bar 252 that is, in turn, connected to an AC to DC converter (not shown) and to batteries (not shown). The 5-volt source 180 and boost voltage source 184 are supplied by a supply bus 254, which is connected to a DC to DC converter (not shown) that converts the load voltage to a 5-volt supply and to a boost-voltage supply. The input ports 170, 172 and the output ports 196, 198 and 200 are connected to a control bus 256.

The system 250 includes a microcontroller 270 that is indirectly powered by the 5-volt source 180 via a voltage converter 271 that supplies 3.3 volts to the microcontroller 270. The microcontroller 270 communicates with the 24 instances of the circuit 100 via multiplexers 272, 274 and 276 and via demultiplexers 278 and 280 that are all powered by the 5-volt source 180. Each multiplexer and demultiplexer has 24 distinct ports configured to communicate with each of the 24 instances of the circuit 100. In an embodiment having a single channel and a single circuit 100, the microcontroller 270 may communicate directly with the ports of the circuit 100 without using any multiplexer or demultiplexer.

A momentary switch 258 is connected to the control bus 256 and may be manually actuated to provide a rearm command 260 that is directly applied to the microcontroller 270. The microcontroller 270 is aware of the status of all circuits 100, the status of each circuit 100 being transmitted by the output port 200 and received at the microcontroller 270 via the multiplexer 276. The microcontroller 270 translates the rearm command 260 into the rearm signal applied at a given circuit 100 whose status indicates a fault. The rearm signal is sent by the microcontroller 270 via the demultiplexer 280 and via the input port 170 of the given circuit 100. The microcontroller 270 may also initiate sending of the rearm signal without manual action of the momentary switch 258, based for example on its internal programming or based a command received at an input 282 of the microcontroller 70 from an external source (not shown).

Programming and monitoring of the microcontroller 270 is made by external components (not shown) connected to the input 282 of the microcontroller 70. The microcontroller 270 may communicate with the same or other external components via an output 284. Details of programming and monitoring of the microcontroller 270 are outside the scope of the present disclosure.

Considering a first channel 1 of 24 and its circuit 100, the measured voltage available at the output port 196, which is representative of the voltage applied to the load of the circuit 100, is received at the multiplexer 272. The measured load current available at the output port 198 is received at the multiplexer 274. The status of the circuit 100 available at the output port 200 is received at the multiplexer 276. These signals from the circuit 100 are provided by the multiplexers 272, 274 and 276 to the microcontroller.

The microcontroller 270 issues the ON/OFF commands and the rearm signal, via the demultiplexers 278 and 280, respectively, these signals being applied to the input ports 172 and 170 of the circuit 100, respectively.

The system 250 has various modes of operation.

When a computer, a server or a similar load is connected to, and energized by, the circuit 100 of a given channel via the load connector 230, in normal operation, the microcontroller 270 may issue a continuous ON command via the demultiplexer 278, this ON command being available at the input port 172 of the circuit 100. The status of the circuit 100 being normal (a logical 1 is present at the output 158 of the NAND gate 152), the optocoupler 210 is turned off and the MOSFET switch 220 is turned on, allowing current to be delivered to the load. The current load is constantly monitored by the high side current monitor 110. If the current exceeds a first predetermined value, for example in case of a short circuit on the load, the voltage $V_{out}$ increases and causes the NAND-gate latch to change its output—which is also the status of the circuit 100—to a logical 0, causing the opening of the MOSFET switch 220, effectively removing power from the server or other load connected to the load connector 230. This disconnection is made via hardware only, without intervention from the microcontroller 270, and is therefore extremely quick, for example in the order of 100 nanoseconds (ns). Thereafter, the NAND-gate latch remains in the same state until the rearm signal is received at the input port 170.

When the server or other load is connected to, and energized by, the circuit 100, the microcontroller 270 may continuously monitor the load voltage and/or the load current via the signals available at the output ports 196 and 198 and provided to the microcontroller 270 by the multiplexers 272 and 274, respectively. Although the voltage $V_{out}$ may be within its normal range at a particular time—no short circuit or other severe fault being present—the microcontroller 270 may detect that the load current is reaching a critical level, exceeding a second predetermined value that, while lower than the first predetermined value, may still be considered as a warning by the microcontroller 270. The microcontroller 270 may cause the demultiplexer 278 to send ON and OFF commands in rapid cycles, causing the opening and closing of the MOSFET switch 220, in turn causing a reduction of the effective voltage and current flowing through the load. The microcontroller 270 may alternatively initiate sending of a continuous OFF command in order to remove all power from the server or other load.

When the load is initially connected by plugging a jack (not shown) into the load connector 230, current flowing through the load connector 230 and the load might increase very rapidly and cause a spark between the jack and the load connector 230. This spark can be quite disturbing to the operator who connects the jack to the load connector 230 and may also cause the accumulation of carbon deposits on the ports of the load connector 230. In an aspect, the system 250 may implement an anti-sparking mechanism to control an initial level of current flowing through the load connector 230 when a load is initially connected. The following paragraphs describe an anti-sparking mechanism.

When the circuit 100 of a given channel is initially energized while no load is connected to the load connector 230, the microcontroller 270 causes the application of an OFF command on the input port 172 of the circuit 100, causing the turning on of the optocoupler 210 and the turning off of the MOSFET switch 220. The output ports 198 and 200 of the circuit 100 respectively indicate to the microcontroller 270 that the load current is null, and that the status of the circuit 100 is normal. The output port 196 indicates to the microcontroller 270 that the voltage available at the load connector 230 is defined by the boost voltage source 184 and by a resistive divider formed by the resistors 178, 186 and 188. Owing to the values of these resistors, for example 10K ohms, 56K ohms and 5.9K ohms, respectively, the voltage available at the load connector 230 is slightly lower than the voltage of the boost voltage source. Respective values of the resistors 186 and 188 are selected in part to maintain the voltage measurement at the output port 196 within a safe voltage range for the multiplexer 272.

Thereafter, when the load is initially connected by plugging a jack into the load connector 230, because the load has a much lower impedance than that of the resistors 186 and 188, the voltage at the load connector 230 falls almost to zero volt. This information is detected at the microcontroller 270 via the output port 196 and the multiplexer 272, the microcontroller 270 being thus informed of the connection of a load to the circuit 100. The microcontroller 270 causes sending of a very brief ON command, or impulse, via the demultiplexer 278 to the input port 172 of the circuit 100, this very brief ON command being immediately followed by an OFF command. For this brief period, the optocoupler 210 is turned off, leading to turning on of the MOSFET switch 220, the appearance of the voltage from the load voltage source 182 at the source 226 of the MOSFET switch 220 and the application of the same voltage to the load connector 230 and to the load. These initial brief ON and OFF commands are rapidly followed by a succession of other similar impulses applied by the microcontroller 270 to the input port 172 of the circuit 100, whereby current is progressively and increasingly applied to the load. In a non-limiting example, the first and second such impulses may be separated in time by a 100 millisecond (ms) delay, following which up to 20 impulses may be applied in an eight (8) ms period. As soon as the microcontroller 270 detects that the voltage at the load connector 230 reaches the value of the load voltage source 182 while the load current reaches the expected value for the load, the ON command becomes a continuous command.

Figure 5:
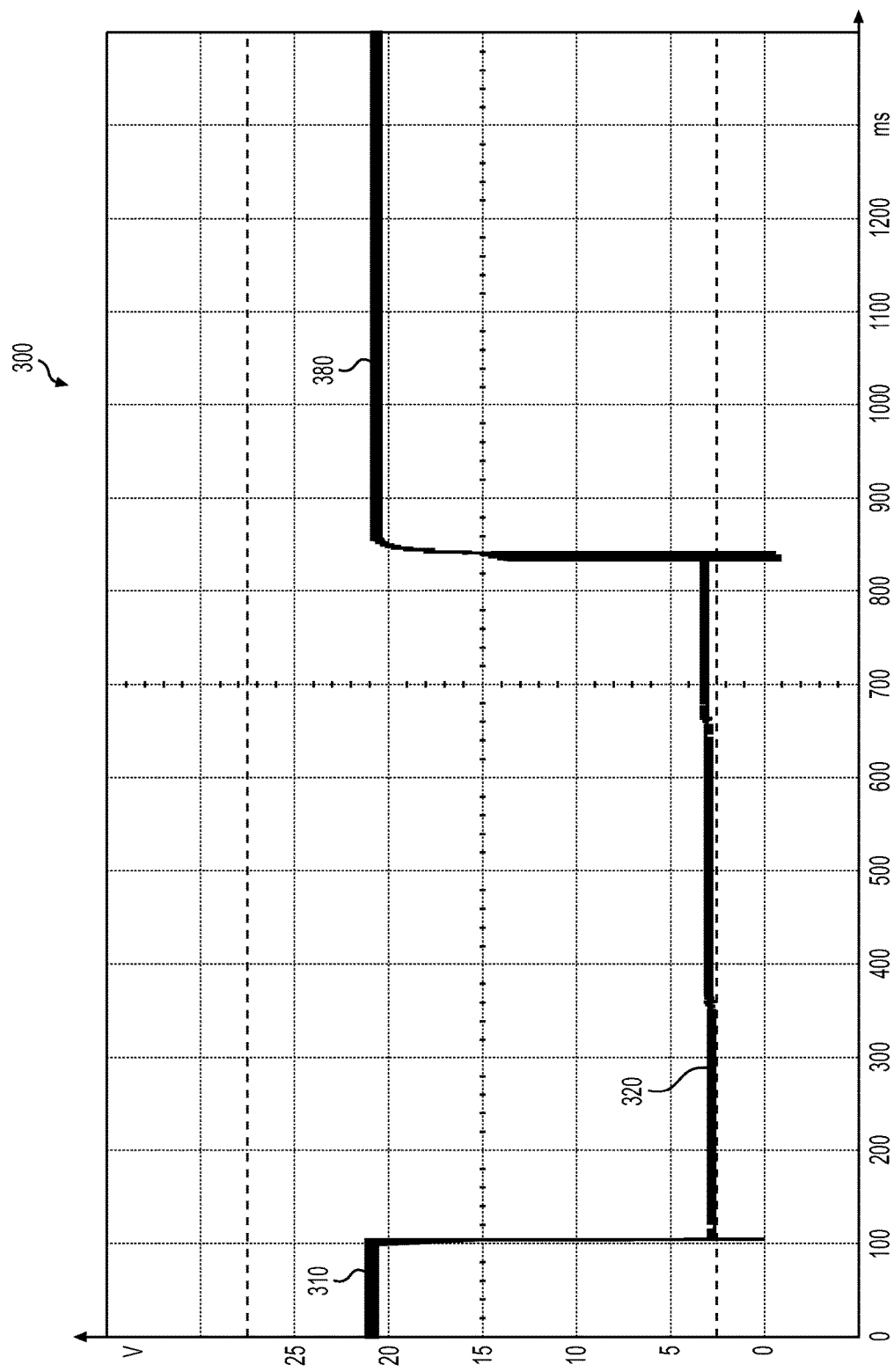
FIG. 5 is timing diagram showing a variation of a voltage when the load is connected to the load connector.

FIG. 5 is a timing diagram showing a variation of a voltage when the load is connected to the load connector. A chart 300 shows a variation of the voltage between the ports 3 and/or 4 of the load connector 230 and the ports 1 and/or 2 of the load connector 230, the latter ports being connected to the ground. Voltage values and timing values shown on FIG. 5 are solely for illustration purposes and do not limit the present disclosure. Initially, at 0 ms, no load is connected to the load connector 230. An initial voltage 310 at the load connector 230 is defined at least in part by the voltage of the boost voltage source 184 and by a resistive divider formed on one hand by the resistor 178 and on the other hand by a sum of the resistors 186 and 188. A fraction of the voltage 310, sampled between the resistors 186 and 188, forms the voltage measurement present at the output port 196.

At 100 ms, a load is plugged in the load connector 230. The load being placed in parallel with the resistor 186 placed in series with the resistor 188, the load having a much lower impedance than the sum of the resistors 186 and 188, the resistive divider now essentially formed by the resistor 178 and the load causes the voltage at the load connector 230 to fall to a much lower value 320. A sample of that value 320 is provided at the output port 196.

The microcontroller 270 detects the voltage drop at the output port 196. After a delay to ensure that the load remains connected, for example about 840 ms, the microcontroller 270 starts issuing software commands Q0, received at the input port 172 of the circuit 100, causing the closing of the MOSFET switch 220.

Figure 6:
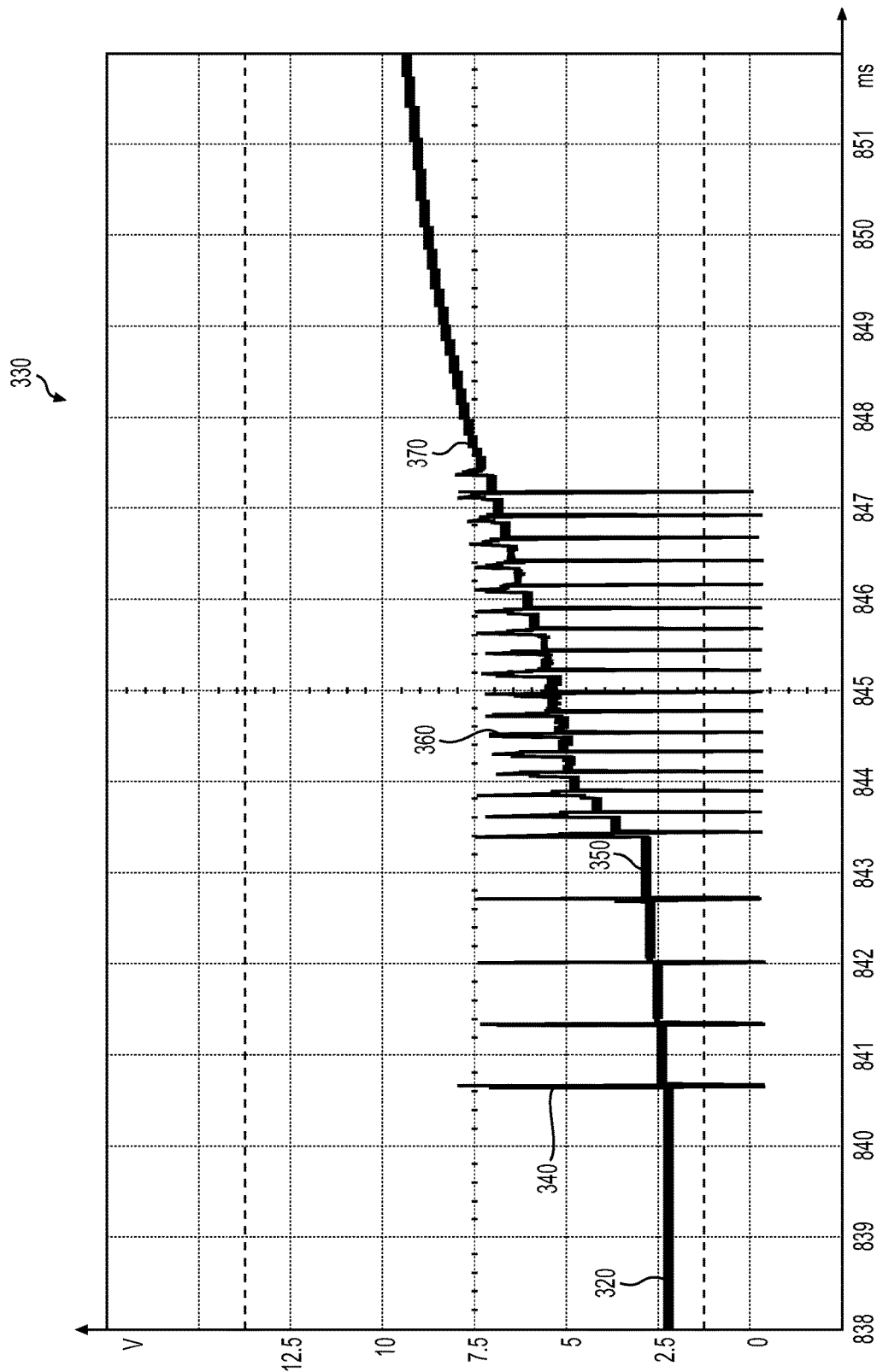
FIG. 6 is zoomed in section of the timing diagram of FIG. 5.

FIG. 6 is zoomed in section of the timing diagram of FIG. 5. A section 330 of the diagram 300 extends from about 838 ms to about 851 ms. At 840 ms, the microcontroller 270 causes the application of very brief software command Q0, which is set to 1, causing the closing of the MOSFET switch 220 for a very brief moment (much like a Dirac impulse 340). A number of successive similar impulses 340, for example three (3) additional impulses, are issued by the microcontroller 270, for example at about 0.7 ms intervals. In the illustration of FIGS. 5 and 6, the load has a large capacitive component, so each brief instances of closing the MOSFET switch 220 causes the accumulation of charges in the load, whereby the voltage at the load connector 230 increases gradually to a value 350. The microcontroller 270 detects a corresponding increase of the voltage sampled at the output port 196. Because the voltage at the load connector 230 is increasing normally, the microcontroller 270 issues a number of additional impulses 360 that are applied to the circuit 100 to close the MOSFET switch 220 in rapid succession, for example at about 0.2 ms intervals. The voltage at the load connector 230 eventually reaches a nominal value 370 that is interpreted by the microcontroller 270 as an indication that the voltage and current are building normally in the load. The microcontroller 270 now issues a continuous software command Q0, which is set to 1, causing the MOSFET switch 220 to remain closed. The voltage at the load connector 230 eventually reaches a nominal value 380 (FIG. 5), which is substantially equal to the voltage of the load voltage source 182.

Those of ordinary skill in the art will realize that the description of the circuit and system implementing the smart fuse and the power supply configured for preventing sparks are illustrative only and are not intended to be in any way limiting. Other embodiments will readily suggest themselves to such persons with ordinary skill in the art having the benefit of the present disclosure. Furthermore, the disclosed circuit and system may be customized to offer valuable solutions to existing needs and problems related to power consumption and sparking found in conventional power supplies. In the interest of clarity, not all of the routine features of the implementations of the circuit and system are shown and described. In particular, combinations of features are not limited to those presented in the foregoing description as combinations of elements listed in the appended claims form an integral part of the present disclosure. It will, of course, be appreciated that in the development of any such actual implementation of the circuit and system, numerous implementation-specific decisions may need to be made in order to achieve the developer's specific goals, such as compliance with application-, system-, and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of electronic power supplies having the benefit of the present disclosure.

In accordance with the present disclosure, the components, process operations, and/or data structures described herein may be implemented using various types of operating systems, computing platforms, network devices, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used.

Systems and modules described herein may comprise software, firmware, hardware, or any combination(s) of software, firmware, or hardware suitable for the purposes described herein. Software and other modules may be executed by a processor and reside on a memory of servers, workstations, personal computers, computerized tablets, personal digital assistants (PDA), and other devices suitable for the purposes described herein. Software and other modules may be accessible via local memory, via a network, via a browser or other application or via other means suitable for the purposes described herein. Data structures described herein may comprise computer files, variables, programming arrays, programming structures, or any electronic information storage schemes or methods, or any combinations thereof, suitable for the purposes described herein.

The circuit and system implementing the smart fuse implemented in accordance with some non-limiting embodiments of the present technology can be represented as follows, presented in numbered clauses.

CLAUSES

[Clause 1] A circuit for powering a load, comprising:
a voltage source;
a transistor connected in series with the voltage source, the transistor further having a gate for turning on and off the transistor, the transistor being connectable in series with the load;
a sensor of a load current, the sensor being adapted to emit a fault signal when the load current exceeds a first predetermined current value;
a hardware latch adapted to set a latch signal when it receives the fault signal and to maintain the latch signal until it receives a rearm signal; and
a logic circuit adapted to receive the latch signal from the hardware latch and to receive a software command for controlling turning on and off of the circuit, the logic circuit converting the software command to a control voltage for application at the gate of the transistor when the latch signal is not set.

[Clause 2] The circuit of clause 1, wherein the sensor of the load current comprises:
a sense resistor connected in series with the transistor; and
a current monitor emitting an output voltage proportional to a current flowing through the sense resistor.

[Clause 3] The circuit of clause 2, wherein the output voltage is sufficient to latch the hardware latch when the load current exceeds the first predetermined current value.

[Clause 4] The circuit of any one of clauses 1 to 3, further comprising a microcontroller adapted to provide the software command for controlling turning on and off of the circuit.

[Clause 5] The circuit of clause 4, wherein the microcontroller is further adapted to provide the rearm signal.

[Clause 6] The circuit of clause 4 or 5, wherein the microcontroller is operatively connected to the sensor of the load current and is adapted to control turning off of the circuit when load current exceeds a second predetermined value, the second predetermined value being less than the first predetermined value.

[Clause 7] The circuit of any one of clauses 1 to 6, wherein the latch signal is a status of the circuit, the latch signal being not set when the circuit has a normal status.

[Clause 8] The circuit of clause 7, wherein the logic circuit comprises:
a combiner of the status of the circuit and of the software command; and
a coupler of the logic circuit and of the transistor, the coupler being configured to cause the control voltage to be applied at the gate of the transistor.

[Clause 9] The circuit of clause 8, wherein the control voltage is a positive voltage to turn on the transistor.

[Clause 10] The circuit of clause 9, further comprising:
a boost voltage source, a boost voltage of the boost voltage source being greater than a voltage of the voltage source; and
a resistive divider connected to the boost voltage source, to the gate of the transistor, and to the coupler;
wherein deactivation of the coupler causes the boost voltage to be applied at the gate of the transistor and turning on of the transistor; and
wherein activation of the coupler causes a voltage applied at the gate to be less than the boost voltage and turning off of the transistor.

[Clause 11] The circuit of clause 10, wherein activation of the coupler effectively connects the gate of the transistor to a source of the transistor.

[Clause 12] The circuit of any one of clauses 8 to 11, wherein the coupler is an optocoupler

[Clause 13] The circuit of any one of clauses 1 to 12, wherein the transistor is a metal oxide semiconductor field effect transistor.

[Clause 14] A system for powering multiple loads, comprising:
a voltage source;
one or more channels, each channel being configured for powering a respective load, each channel comprising:
a transistor connected in series with the voltage, the transistor further having a gate for turning on and off the transistor, the transistor being connectable in series with the respective load,
a sensor of a load current, the sensor being adapted to emit a fault signal when the load current exceeds a first predetermined current value,
a hardware latch adapted to set a latch signal when it receives the fault signal and to maintain the latch signal until it receives a rearm signal, and
a logic circuit adapted to receive the latch signal from the hardware latch and to receive a software command for controlling turning on and off of the transistor, the logic circuit converting the software command to a control voltage for application at the gate of the transistor when the latch signal is not set; and
a microcontroller operatively connected to the hardware latch and to the logic circuit of each channel, the microcontroller being adapted to provide software commands for individually turning on and off the transistor of each channel and to provide rearm signals for individually resetting the hardware latch of each channel.

[Clause 15] The system of clause 14, wherein the microcontroller is adapted to individually receive the latch signal of each channel, the microcontroller interpreting the latch signal from a given channel as a normal status of the given channel when the latch signal is not set.

[Clause 16] The system of clause 14 or 15, wherein the microcontroller is adapted to individually receive a measurement of a load voltage for each channel.

[Clause 17] The system of any one of clauses 14 to 16, wherein the microcontroller is adapted to individually receive a measurement of the load current for each channel

[Clause 18] The system of clause 17, wherein the one or more channels comprise a plurality of channels, the system further comprising:
a first demultiplexer adapted to individually transmit the software commands to the logic circuit of each channel; and
a second demultiplexer adapted to individually transmit the rearm signals to the hardware latches of each channel.

[Clause 19] The system of clause 18, further comprising:
a first multiplexer adapted to individually receive the latch signal from each of the plurality of channels;
a second multiplexer adapted to individually receive the measurement of the load voltage from each of the plurality of channels; and
a third multiplexer adapted to individually receive the measurement of the load current from each of the plurality of channels.

[Clause 20] The system of clause 19, wherein the microcontroller is adapted to:
detect the status of each individual channel;
conditionally forward a software command to the logic circuit of a given channel for turning on the transistor of the given channel if the status of the given individual channel is normal.

[Clause 21] The system of clause 19 or 20, further comprising a momentary switch operatively connected to the microcontroller, wherein the microcontroller is further adapted to:
detect a rearm command from the momentary switch;
detect that statuses of one or more of the plurality of channel are not normal; and
forward a rearm signal to the one or more of the plurality of channels.

The present disclosure has been described in the foregoing specification by means of non-restrictive illustrative embodiments provided as examples. These illustrative embodiments may be modified at will. The scope of the claims should not be limited by the embodiments set forth in the examples, but should be given the broadest interpretation consistent with the description as a whole.

What is claimed is:

1. A system for powering multiple loads, comprising:
a voltage source;
one or more channels, each channel being configured for powering a respective load, each channel comprising:
a transistor connected in series with the voltage source, the transistor being connectable in series with the respective load, turning on the transistor causing power to be delivered from the voltage source to the respective load;
a sensor of a current in the respective load, the sensor being adapted to emit a fault signal when the current in the respective load exceeds a first predetermined current value;
a hardware latch adapted to set a latch signal when it receives the fault signal and to maintain the latch signal until it receives a rearm signal; and
a logic circuit adapted to:
receive the latch signal from the hardware latch,
apply at a gate of the transistor a control voltage causing turning off of the transistor when the latch signal is set,
receive a software command, and
convert the software command to a control voltage for application at the gate of the transistor for turning off and then on the transistor when the latch signal is not set; and
a microcontroller operatively connected to the hardware latch and to the logic circuit of each channel, the microcontroller being adapted to provide software commands for individually turning on and off the transistor of each channel and to provide rearm signals for individually resetting the hardware latch of each channel.

2. The system of claim 1, wherein, in each channel, the sensor of the current in the respective load comprises:
a sense resistor connected in series with the transistor; and
a current monitor emitting an output voltage proportional to a current flowing through the sense resistor.

3. The system of claim 2, wherein, in each channel, the output voltage is sufficient to cause the sensor of the current in the respective load to emit the fault signal when the current in the respective load exceeds the first predetermined current value.

4. The system of claim 1, wherein each channel has a status, the status being normal when the latch signal is not set, the status being not normal when the latch signal is set.

5. The system of claim 4, wherein, in each channel, the logic circuit comprises:
a combiner of the status of the channel and of the software command; and
a coupler of the logic circuit and of the transistor, the coupler being configured to cause the control voltage to be applied at the gate of the transistor.

6. The system of claim 5, further comprising:
a boost voltage source, a boost voltage of the boost voltage source being positive and greater than a voltage of the voltage source;
wherein each channel further comprises a resistive divider connected to the boost voltage source, to the gate of the transistor, and to the coupler;
wherein, in each channel, the combiner causes a deactivation of the coupler when, concurrently, the status of the channel is normal and the software command is a command to turn on the transistor;
wherein, in each channel, the combiner causes an activation of the coupler when the status of the channel is not normal, or when the software command is a command to turn off the transistor, or both;
wherein, in each channel, deactivation of the coupler causes the boost voltage to be applied at the gate of the transistor for turning on of the transistor; and
wherein, in each channel, activation of the coupler causes a voltage defined at least in part by the boost voltage source and by the resistive divider to be applied at the gate and to be less than the boost voltage for turning off of the transistor.

7. The system of claim 1, wherein the microcontroller is operatively connected to the sensor of the current in the respective load of each channel and is adapted to control turning off of the transistor of a given channel when the current in the respective load for the given channel exceeds a second predetermined value, the second predetermined value being less than the first predetermined value.

8. The system of claim 1, wherein:
the microcontroller is adapted to individually receive the latch signal of each channel, the microcontroller interpreting the latch signal from a given channel as a normal status of the given channel when the latch signal is not set;
the microcontroller is adapted to individually receive a measurement of a load voltage for each channel; and
the microcontroller is adapted to individually receive a measurement of the current in the respective load for each channel.

9. The system of claim 8, wherein the one or more channels comprise a plurality of channels, the system further comprising:
a first demultiplexer adapted to individually transmit the software commands to the logic circuit of each channel; and
a second demultiplexer adapted to individually transmit the rearm signals to the hardware latches of each channel.

10. The system of claim 9, further comprising:
a first multiplexer adapted to individually receive the latch signal from each of the plurality of channels;
a second multiplexer adapted to individually receive the measurement of the load voltage from each of the plurality of channels; and
a third multiplexer adapted to individually receive the measurement of the current in the respective load from each of the plurality of channels.

11. The system of claim 10, wherein the microcontroller is adapted to:
detect the status of each individual channel;
conditionally forward a software command to the logic circuit of a given channel for turning on the transistor of the given channel when the status of the given individual channel is normal.

12. The system of claim 10, further comprising a momentary switch operatively connected to the microcontroller, wherein the microcontroller is further adapted to:
detect a rearm command from the momentary switch;
detect that statuses of one or more of the plurality of channels are not normal; and
forward a rearm signal to the one or more of the plurality of channels.

* * * * *